(12) United States Patent
Toyama

(10) Patent No.: US 12,087,725 B2
(45) Date of Patent: Sep. 10, 2024

(54) WIRE BONDING APPARATUS, METHOD FOR MEASURING OPENING AMOUNT OF CLAMP APPARATUS, AND METHOD FOR CALIBRATING CLAMP APPARATUS

(71) Applicant: SHINKAWA LTD., Tokyo (JP)

(72) Inventor: Toshihiko Toyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 527 days.

(21) Appl. No.: 17/603,584

(22) PCT Filed: Sep. 4, 2020

(86) PCT No.: PCT/JP2020/033585
§ 371 (c)(1),
(2) Date: Oct. 14, 2021

(87) PCT Pub. No.: WO2022/049721
PCT Pub. Date: Mar. 10, 2022

(65) Prior Publication Data
US 2022/0310552 A1    Sep. 29, 2022

(51) Int. Cl.
*B23K 20/00* (2006.01)
*H01L 23/00* (2006.01)

(52) U.S. Cl.
CPC ............ *H01L 24/78* (2013.01); *B23K 20/004* (2013.01); *B23K 20/005* (2013.01);
(Continued)

(58) Field of Classification Search
CPC ........... H01L 24/78; H01L 2224/78001; H01L 2224/78353; H01L 2224/78621;
(Continued)

(56) References Cited

U.S. PATENT DOCUMENTS 5,238,173 A * 8/1993 Ura .................. H01L 24/78
228/104
5,699,951 A * 12/1997 Miyoshi ............ H01L 24/85
228/55
(Continued)

FOREIGN PATENT DOCUMENTS

CN    103909341 A  *  7/2014   ........... B23K 20/123
CN    109844914 A  *  6/2019   ........... B23K 20/007
(Continued)

OTHER PUBLICATIONS

"International Search Report (Form PCT/ISA/210) of PCT/JP2020/033585", mailed on Nov. 10, 2020, pp. 1-3.

*Primary Examiner* — Kiley S Stoner
(74) *Attorney, Agent, or Firm* — JCIPRNET

(57) ABSTRACT

A wire bonding apparatus of an aspect includes: a clamp apparatus, having a pair of arms; a stage, moving the clamp apparatus in a horizontal direction; a rod member; a contact detection part, detecting contact between the rod member and the clamp apparatus; and a control apparatus, controlling opening and closing of the pair of arms and an operation of the stage and acquiring position information of the clamp apparatus. The control apparatus obtains an opening amount of the pair of arms based on position information of the clamp apparatus at a time when an outer side surface of a first arm contacts the rod member in a state where the pair of arms are closed and position information of the clamp apparatus at the time when the outer side surface of the first arm contacts the rod member in a state where the pair of arms are open.

8 Claims, 10 Drawing Sheets

(52) U.S. Cl.
CPC ............. *H01L 2224/78001* (2013.01); *H01L 2224/78353* (2013.01); *H01L 2224/78621* (2013.01)

(58) Field of Classification Search
CPC ... H01L 24/45; H01L 24/49; H01L 2224/451; H01L 2224/49171; H01L 2224/78; H01L 2224/78301; H01L 2224/789; H01L 2224/859; H01L 21/60; H01L 24/85; H01L 21/68; H01L 2224/787; H01L 24/745; H01L 2224/745; B23K 20/004; B23K 20/10; B23K 20/24; B23K 20/26; B23K 20/005; B23K 20/007
USPC ............. 228/4.5, 180.5, 904, 102–103, 8–12
See application file for complete search history.

(56) References Cited

U.S. PATENT DOCUMENTS

| | | | |
|---|---|---|---|
| 8,191,759 | B2 | 6/2012 | Tei et al. |
| 11,004,822 | B2 | 5/2021 | Uchida et al. |
| 2009/0200357 | A1* | 8/2009 | Lee .................... H01L 24/78 228/44.7 |
| 2019/0237428 | A1 | 8/2019 | Fujino et al. |

FOREIGN PATENT DOCUMENTS

| | | | | | |
|---|---|---|---|---|---|
| JP | 59211242 | A | * | 11/1984 | ............ H01L 24/78 |
| JP | H0786327 | | | 3/1995 | |
| JP | H07153788 | A | * | 6/1995 | |
| JP | H07297222 | A | * | 11/1995 | |
| JP | H08107124 | A | * | 4/1996 | |
| JP | H09223708 | A | * | 8/1997 | |
| JP | H10321664 | A | * | 12/1998 | |
| JP | 2001168136 | A | * | 6/2001 | ............ H01L 24/78 |
| JP | 2002231745 | A | * | 8/2002 | |
| JP | 3385942 | B2 | * | 3/2003 | ............ H01L 24/78 |
| JP | 2008141025 | A | * | 6/2008 | ............ H01L 24/78 |
| JP | 2009152480 | A | * | 7/2009 | ............ H01L 24/78 |
| JP | 2010161176 | | | 7/2010 | |
| JP | 2011049498 | | | 3/2011 | |
| WO | WO-2009093358 | A1 | * | 7/2009 | ............ H01L 24/78 |
| WO | 2017217385 | | | 12/2017 | |
| WO | WO-2017217385 | A1 | * | 12/2017 | ........... B06B 1/0246 |
| WO | 2018038135 | | | 3/2018 | |
| WO | WO-2018047896 | A1 | * | 3/2018 | ............ H01L 24/44 |

* cited by examiner

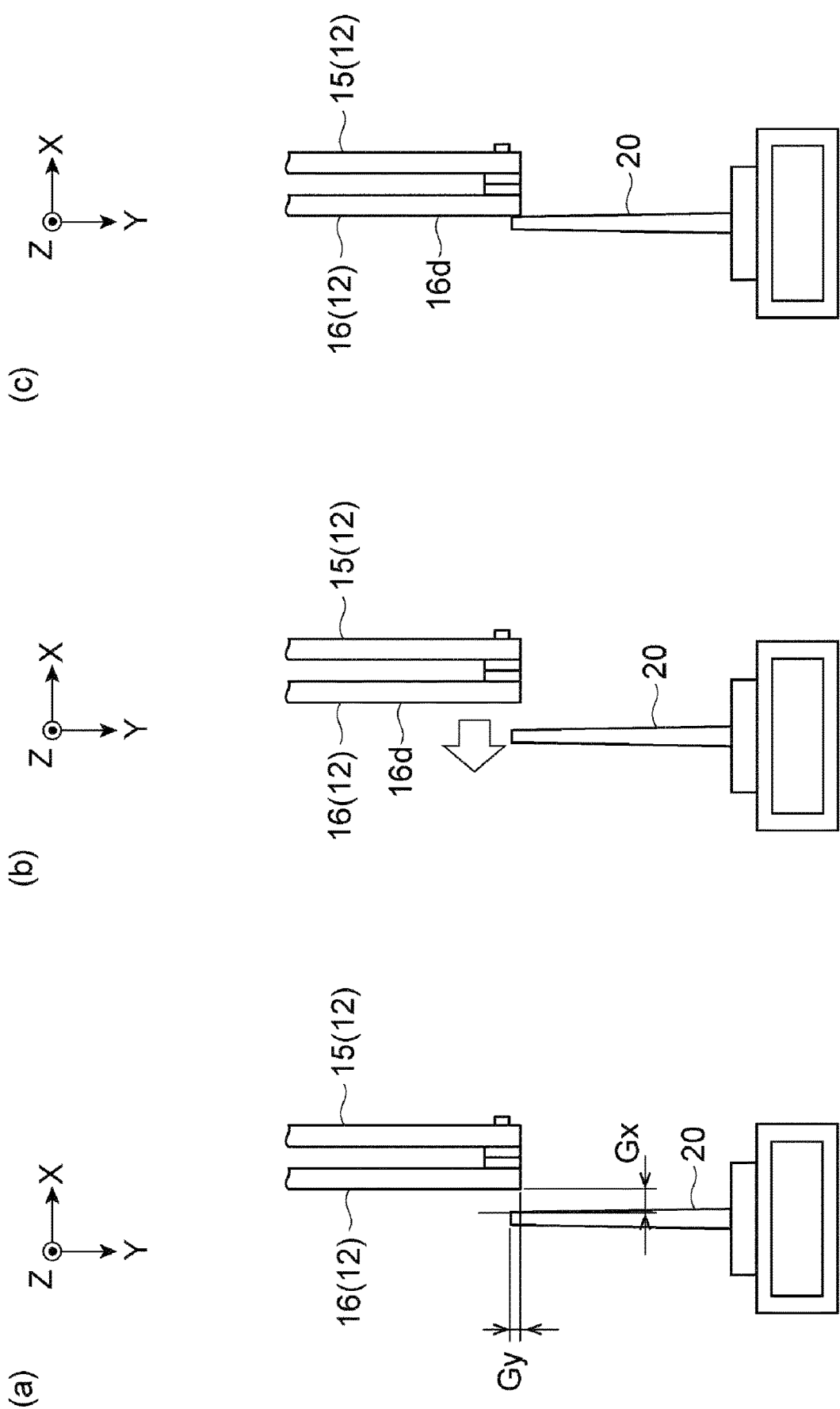

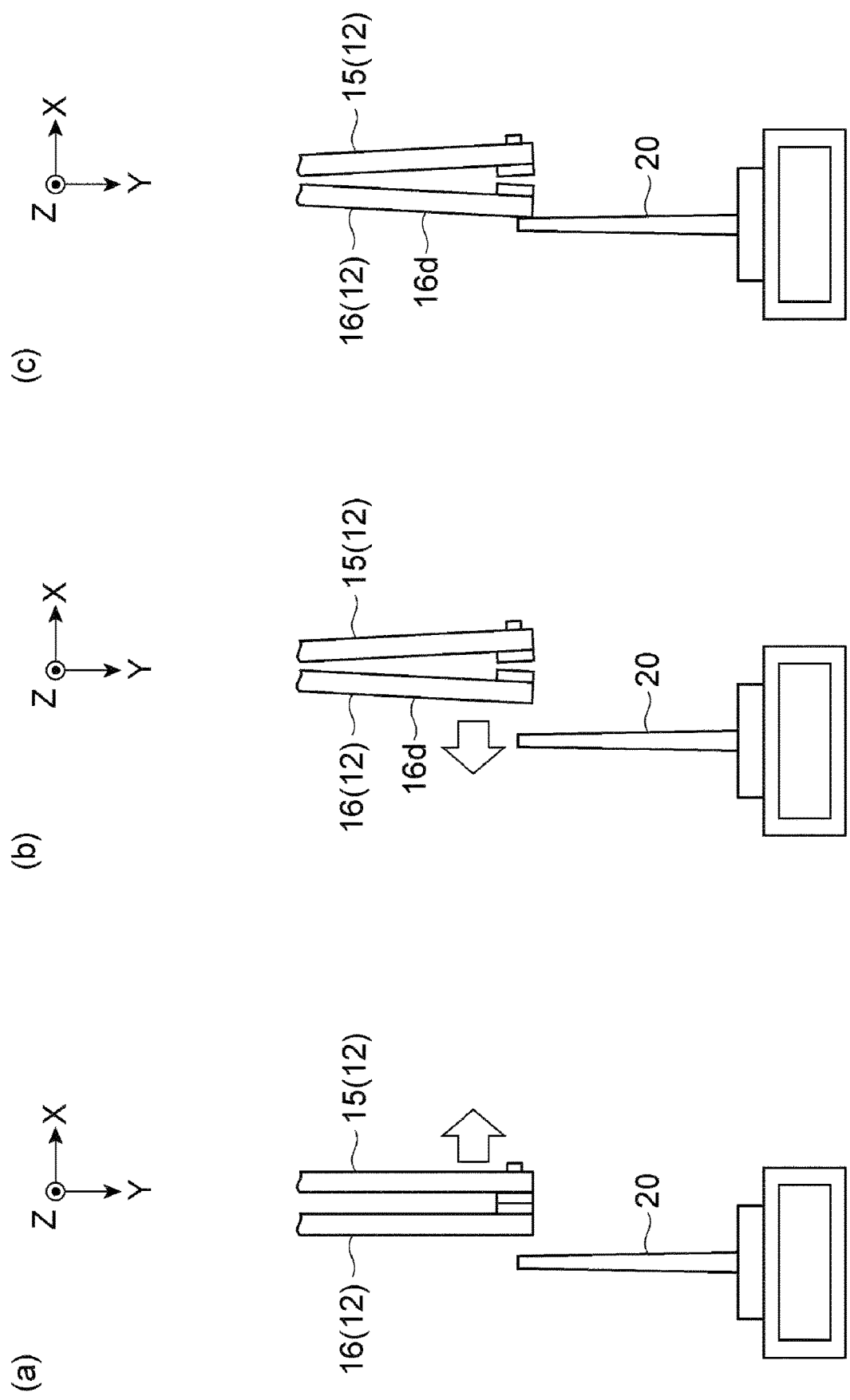

US 12,087,725 B2

WIRE BONDING APPARATUS, METHOD FOR MEASURING OPENING AMOUNT OF CLAMP APPARATUS, AND METHOD FOR CALIBRATING CLAMP APPARATUS

CROSS-REFERENCE TO RELATED APPLICATION

This application is a 371 application of the International PCT application serial no. PCT/JP2020/033585, filed on Sep. 4, 2020. The entirety of the above-mentioned patent application is hereby incorporated by reference herein and made a part of this specification.

BACKGROUND OF THE INVENTION

1. Field of the Invention

The disclosure relates to a wire bonding apparatus, a method for measuring an opening amount of a clamp apparatus, and a method for calibrating a clamp apparatus.

2. Description of Related Art

A wire bonding apparatus for electrically connecting an electrode formed on a semiconductor chip and an electrode formed on a circuit substrate by using a metallic wire is known. For example, a wire bonding apparatus described in Patent Document 1 indicated in the following includes a capillary in which a bonding wire is inserted, a first clamp linked with the capillary to move, a second clamp holding the wire above the first clamp, and a control part controlling opening or closing of the first clamp and the second clamp.

The apparatus bonds the wire in the state where the first clamp is closed and the second clamp is open, and then raises the capillary and the first clamp to cut off the wire. Then, the apparatus raises the capillary and the first clamp in the state where the first clamp is open and the second clamp is closed to extend the wire from the capillary.

PRIOR ART DOCUMENT

Patent Document(s)

Patent Document 1: Japanese Laid-open No. 2010-161176

SUMMARY OF THE INVENTION

Problems to be Solved by the Invention

In the wire bonding apparatus, in order to perform desired bonding, it is favorable to control the opening amount of the clamp apparatus holding the wire at high accuracy. However, the opening amount of the clamp apparatus is affected by the environment in which the wire bonding apparatus is used. Therefore, there may be a difference in the opening amount of the clamp apparatus mounted in multiple wire bonding apparatuses used in different environments. When there is a difference in the opening amount of the clamp apparatus, the loop shapes or tail lengths of wires may vary, which reduces the reliability of the wire bonding apparatus. Therefore, it is favorable to measure the opening amount of the clamp apparatus at high accuracy.

In a state where the clamp apparatus is removed from the bonding apparatus, the opening amount of the clamp apparatus can be measured by using a laser displacement meter, etc. However, the opening amount of the clamp apparatus is also affected by the temperature condition when the wire bonding apparatus is used. Therefore, it is required that the opening amount of the clamp apparatus be measured in the state where the clamp apparatus is installed to the bonding apparatus.

Means for Solving Problems

A wire bonding apparatus according to an aspect includes: a clamp apparatus, having a pair of arms; a stage, moving the clamp apparatus in a horizontal direction; a rod member; a contact detection part, detecting contact between the rod member and the clamp apparatus; and a control apparatus, controlling opening and closing of the pair of arms and an operation of the stage and, acquiring position information of the clamp apparatus. The control apparatus executes a first control to make an outer side surface of a first arm of the pair of arms contact the rod member in a state where the pair of arms are closed by moving the clamp apparatus, and acquires the position information of the clamp apparatus at a time of contacting the rod member, executes a second control to make the outer side surface of the first arm contact the rod member in a state where the pair of arms are open by moving the clamp apparatus, and acquires the position information of the clamp apparatus at the time of contacting the rod member, and executes a third control to obtain an opening amount of the pair of arms based on the position information of the clamp apparatus acquired in the first control and the second control.

In the wire bonding apparatus of the above aspect, the opening amount of the clamp apparatus is obtained based on the position information at the time when the outer side surface of the first arm contacts the rod member in the state where the pair of arms are closed and the position information at the time when the outer side surface of the first arm contacts the rod member in the state where the pair of arms are open. Therefore, the opening amount of the clamp apparatus can be measured in the state where the clamp apparatus is installed to the wire bonding apparatus.

In an embodiment, the control apparatus may further execute a fourth control to make an outer side surface of a second arm of the pair of arms contact the rod member in the state where the pair of arms are closed by moving the clamp apparatus, and acquires the position information of the clamp apparatus at the time of contacting the rod member, and a fifth control to make the outer side surface of the second arm contact the rod member in the state where the pair of arms are open by moving the clamp apparatus, and acquires the position information of the clamp apparatus at the time of contacting the rod member, and may execute a third control to obtain an opening amount of the pair of arms based on the position information of the clamp apparatus acquired in the first control and the second control.

In the embodiment, the opening amount of the clamp apparatus is obtained by further using the position information at the time when the outer side surface of the second arm contacts the rod member in the state where the pair of arms are closed and the position information at the time when the outer side surface of the second arm contacts the rod member in the state where the pair of arms are open, thereby obtaining the opening amount of the clamp apparatus at a higher accuracy.

In an embodiment, the control apparatus may further execute a sixth control, which is executed prior to the first control, to make a tip part of the first arm or the second arm contact a tip part of the rod member by moving the clamp apparatus, and acquire the position information of the clamp apparatus at the time of contacting the rod member.

In the embodiment, since the position information of the clamp apparatus at the time when the tip part of the first arm or the second arm contacts the tip part of the rod member is acquired, the position information of the tip part of the rod member can be obtained.

In an embodiment, the rod member may further include a lifting mechanism moving the rod member in an up-down direction.

In the embodiment, by moving the rod in the up-down direction, the contact or interference between the clamp apparatus and the rod member at the time of wire bonding can be prevented.

In another aspect, a method for measuring an opening amount of a clamp apparatus having a pair of arms able to open or close. The method includes: a first process of making an outer side surface of a first arm of the pair of arms contact a rod member in a state where the pair of arms are closed by moving the clamp apparatus, and acquiring position information of the clamp apparatus at a time of contacting the rod member, a second process of making the outer side surface of the first arm contact the rod member in a state where the pair of arms are open by moving the clamp apparatus, and acquiring the position information of the clamp apparatus at the time of contacting the rod member, and a third process of obtaining an opening amount of the pair of arms based on the position information of the clamp apparatus acquired in the first process and the second process.

Therefore, in the method for measuring the opening amount of the clamp apparatus in the aspect, the opening amount of the clamp apparatus can be measured in the state where the clamp apparatus is installed to the wire bonding apparatus.

The method for measuring the opening amount of the clamp apparatus of an embodiment may further include: a fourth process of making an outer side surface of a second arm of the pair of arms contact the rod member in the state where the pair of arms are closed by moving the clamp apparatus, and acquiring the position information of the clamp apparatus at the time of contacting the rod member, and a fifth process of making the outer side surface of the second arm contact the rod member in the state where the pair of arms are open by moving the clamp apparatus, and acquiring the position information of the clamp apparatus at the time of contacting the rod member. In the third process, the opening amount of the pair of arms is obtained by further using the position information of the clamp apparatus acquired in the fourth process and the fifth process.

In the method for measuring the opening amount of the clamp apparatus of the embodiment, the opening amount of the clamp apparatus can be measured at a higher accuracy.

In an embodiment, the method for measuring the opening amount of the clamp apparatus may further include a sixth process, which is executed prior to the first process, of making a tip part of the first arm or the second arm contact a tip part of the rod member by moving the clamp apparatus, and acquiring the position information of the clamp apparatus at the time of contacting the rod member.

In the method for measuring the opening amount of the clamp apparatus of the embodiment, the position information of the tip part of the rod member can be obtained.

A method for calibrating a clamp apparatus according to an aspect includes a process of obtaining an opening amount of a clamp apparatus according to the method for measuring the opening amount of the clamp apparatus and a process of calibrating the clamp apparatus based on the opening amount of the clamp apparatus.

In the calibration method, by calibrating the clamp apparatus, an error between the opening amount of the clamp apparatus designated by the control signal and the actual opening amount of the clamp apparatus can be reduced.

Inventive Effects

According to an aspect and various embodiments of the present invention, the opening amount of the clamp apparatus can be measured in the state where the clamp apparatus is installed to the bonding apparatus.

BRIEF DESCRIPTION OF THE DRAWINGS

FIG. 9 is a schematic top view illustrating a movement of a clamp apparatus.

FIG. 10 is a schematic top view illustrating a movement of a clamp apparatus.

DESCRIPTION OF THE EMBODIMENTS

Figure 1:
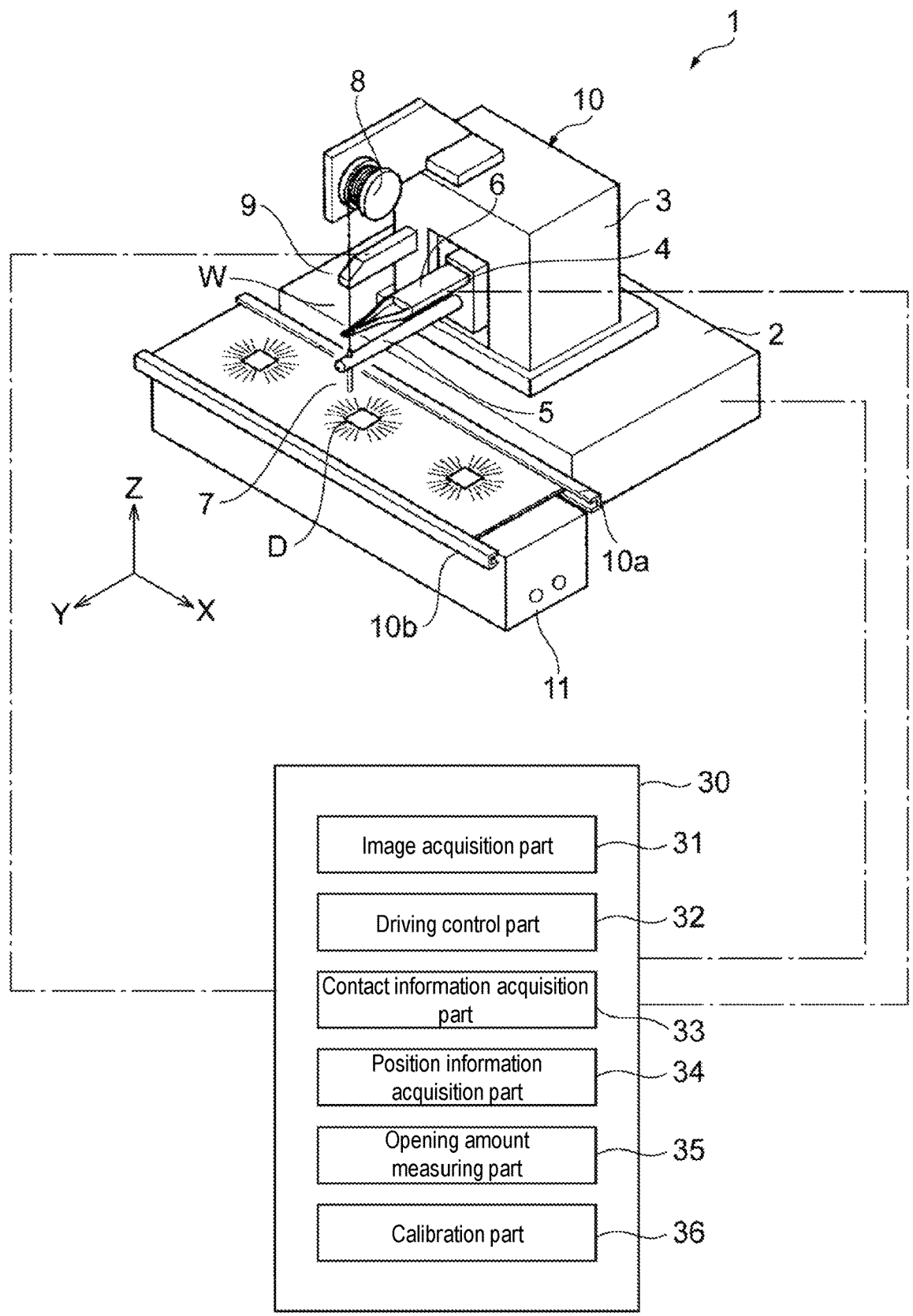
FIG. 1 is a perspective view illustrating a wire bonding apparatus according to an embodiment.

Hereinafter, embodiments of the disclosure will be described with reference to the drawings. In the following description, the same or equivalent elements are designated by the same reference numerals, and duplicate description will not be repeated. The dimensional ratios in the drawings do not always match those described.

Figure 2:
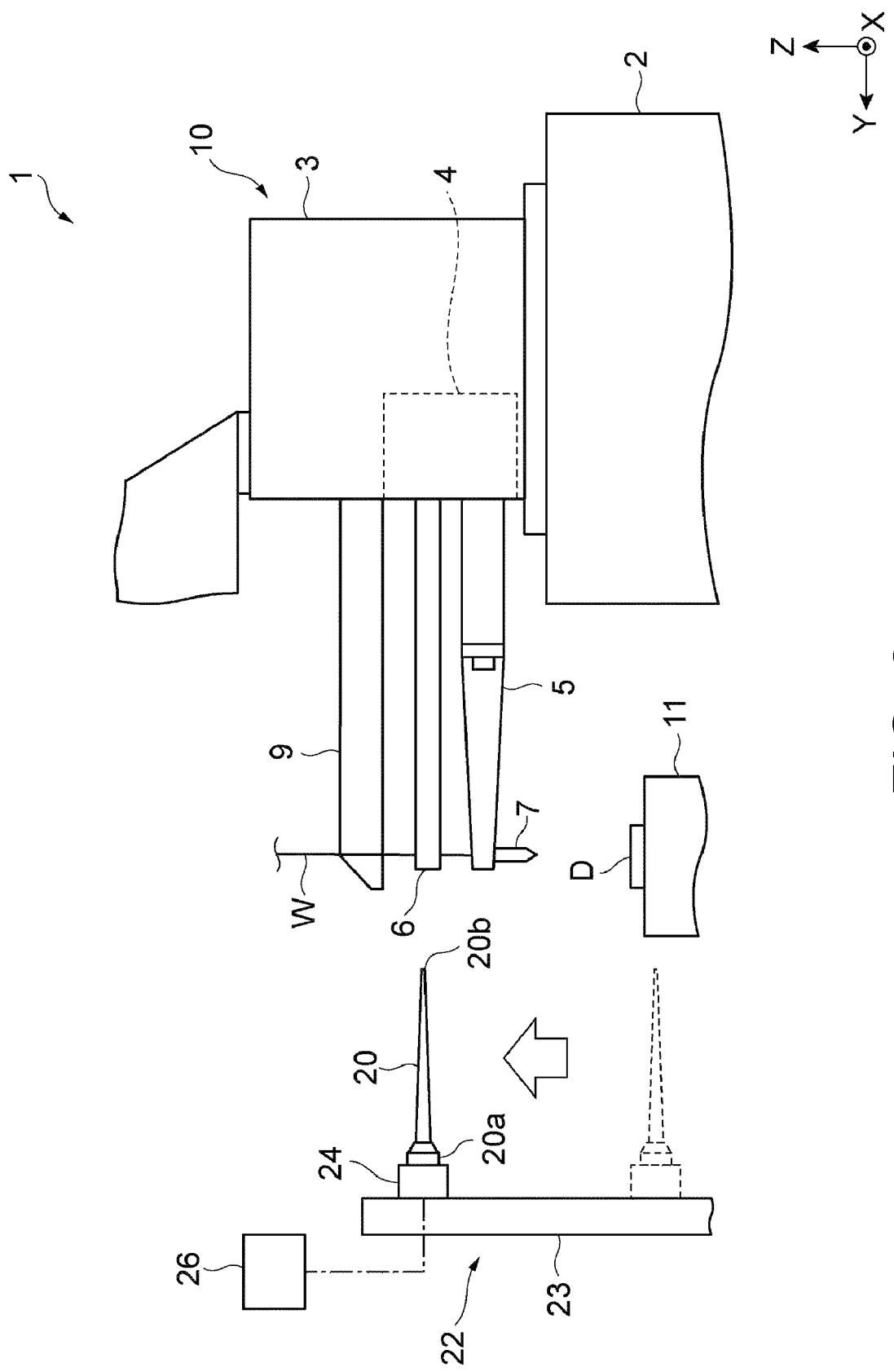
FIG. 2 is a side view illustrating a wire bonding apparatus according to an embodiment.

FIG. 1 is a perspective view of a wire bonding apparatus according to an embodiment. FIG. 2 is a side view of a wire bonding apparatus. A wire bonding apparatus 1 shown in FIGS. 1 and 2 bonds a wire W to a semiconductor chip D disposed on a circuit substrate. In FIGS. 1 and 2, three directions orthogonal to each other, i.e., X direction (first direction), Y direction (second direction) and Z direction (third direction), are shown. X direction indicates a direction in which the semiconductor chip D, which is a bonding target, is conveyed, Y direction indicates a horizontal direction perpendicular to X direction, and Z direction indicates a direction of the height of the wire bonding apparatus 1. In FIG. 1, for the ease of description, a rod member 20 to be described afterwards is omitted.

As shown in FIGS. 1 and 2, the wire bonding apparatus 1 includes an XY stage 2, a bonding unit 10, the rod member 20, and a control apparatus 30. The XY stage 2 supports the bonding unit 10 on the XY stage 2. The XY stage 2 moves the bonding unit 10 supported on the XY stage 2 along a horizontal direction in the XY plane which is a two-dimensional plane including X direction and Y direction by a stepping motor, for example. The XY stage 2 outputs information indicating coordinate positions in the XY plane of the XY stage 2 as an encoder output.

The bonding unit 10 has a bonding head 3, a Z direction driving mechanism 4, an ultrasonic horn 5, a clamp apparatus 6, a capillary 7, a spool 8, and a camera 9. The bonding head 3 is supported on the XY stage 2. The Z direction driving mechanism 4 is installed to the bonding head 3. The Z direction driving mechanism 4 moves the clamp apparatus 6 and the capillary 7 in Z direction by rotating about a rotation axis extending in X direction by a driving force of a motor, for example.

The ultrasonic horn 5 is installed to the Z direction driving mechanism 4. Therefore, the ultrasonic horn 5 is moved to X direction and Y direction through driving of the XY stage 2. The ultrasonic horn 5 extends in Y direction from the Z direction driving mechanism 4, and the capillary 7 is installed to the tip of the ultrasonic horn 5. The wire W supplied from the spool 8 is inserted into the capillary 7. The capillary 7 bonds the wire W to the semiconductor chip D.

The clamp apparatus 6 is installed to the Z direction driving mechanism 4 above the capillary 7. Therefore, the clamp apparatus 6 moves together with the ultrasonic horn 5 in X direction and Y direction through driving of the XY stage 2.

Figure 3:
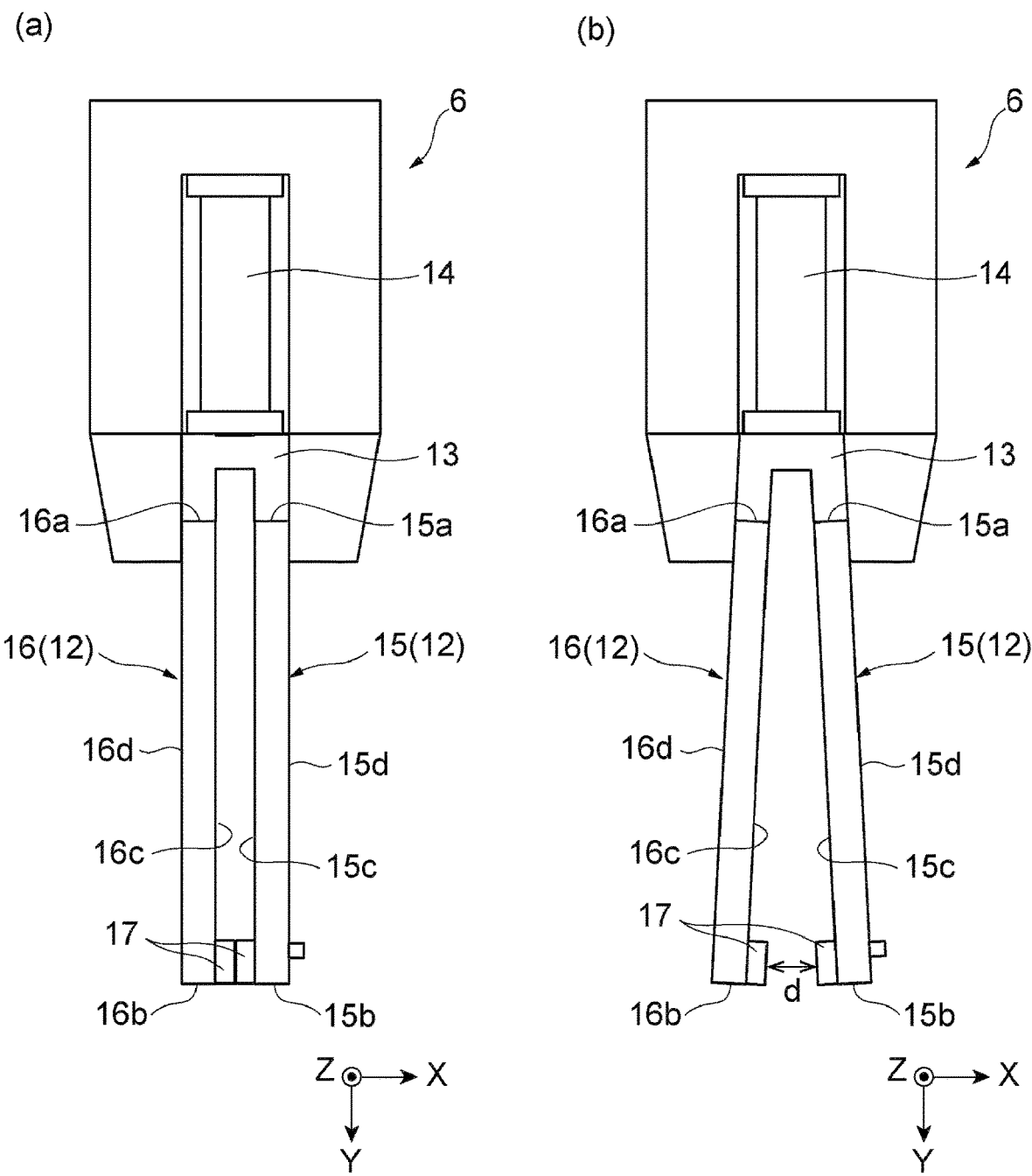
FIG. 3 is a schematic top view illustrating a clamp apparatus.

(a) of FIG. 3 is an exemplary top view schematically illustrating the clamp apparatus 6. As shown in (a) of FIG. 3, the clamp apparatus 6 has a pair of arms 12, a deformation part 13, and a driving part 14. The pair of arms 12 are open or closed by approaching or moving away from each other in X direction. The clamp apparatus 6 holds the wire W above the capillary 7 by opening or closing the pair of arms 12.

The pair of arms 12 includes a first arm 15 and a second arm 16. The first arm 15 extends in Y direction between a base part 15a and a tip part 15b. The first arm 15 includes an inner side surface 15c located on the inner side of the opening/closing direction (X direction) of the pair of arms 12 and an outer side surface 15d located on the outer side of the opening/closing direction of the pair of arms 12. Similarly, the second arm 16 extends in Y direction between a base part 16a and a tip part 16b. The second arm 16 includes an inner side surface 16c located on the inner side of the opening/closing direction (X direction) of the pair of arms 12 and an outer side surface 16d located on the outer side of the opening/closing direction of the pair of arms 12.

A pair of clamp sheets 17 sandwiching the wire W are provided on the inner side surface 15c of the first arm 15 and the inner side surface 16c of the second arm 16. The pair of clamp sheets 17 are fixed to the inner side surface 15c of the first arm 15 and the inner side surface 16c of the second arm 16 at positions close to the tip part 15b and the tip part 16b.

The base parts 15a and 16a of the pair of arms 12 are connected to the deformation part 13. The deformation part 13 is provided between the pair of arms 12 and the driving part 14. The deformation part 13 has a "⊐-like planar shape, for example, and is deformed as the driving part 14 extends/contracts.

The driving part 14 is, for example, a piezoelectric element that converts electrical energy into kinetic energy in correspondence with an applied voltage. When a predetermined voltage is applied to the driving part 14, the driving part 14 extends in Y direction to press the deformation part 13. The deformation part 13 pressed by the driving part 14, as shown in (b) of FIG. 13, elastically deforms to open the pair of arms 12 in X direction. On the contrary, when the voltage applied to the driving part 14 stops, the driving part 14 contracts in Y direction, and the deformation part 13 elastically deforms so as to close the pair of arms 12. The voltage applied to the driving part 14 is controlled by a control signal transmitted from the control apparatus 30. That is, the clamp apparatus 6 opens and closes the pair of arms 12 to match an opening amount designated by the control apparatus 30.

Referring to FIG. 1 again, the camera 9 is disposed at a position deviated with respect to the clamp apparatus 6 in X direction. The camera 9, for example, is installed to the bonding head 3 and moves with the clamp apparatus 6 and the capillary 7 in X direction and Y direction through driving of the XY stage 2. The camera 9, for example, captures an image of a region including the semiconductor chip D and the capillary 7, and outputs captured image data to the control apparatus 30.

In addition, a bonding stage 11 supporting the semiconductor chip D which is the bonding target is disposed in front of the bonding head 3 in Y direction. On the bonding stage 11, a conveyance apparatus 11a is disposed. The conveyance apparatus 11a conveys the semiconductor chip D mounted on the circuit substrate in X direction.

As shown in FIG. 2, the rod member 20 is disposed in front of the bonding unit 10 in Y direction. The rod member 20 is an elongated member formed by a conductive material, such as metal. The rod member 20 has a base part 20a and a tip part 20b, and extends in Y direction between the base part 20a and the tip part 20b.

A contact detection part 26 is connected to the rod member 20. The contact detection part 26 detects a contact state between the clamp apparatus 6 and the rod member 20. For example, a voltage is applied to the rod member 20, and the contact detection part 26 detects a current flowing to the rod member 20. When detecting that a current flows to the rod member 20 through the clamp apparatus 6 and the rod member 20 contacting each other, for example, the contact detection part 26 outputs contact information indicating that the clamp apparatus 6 and the rod member 20 contact each other to the control apparatus 30.

In addition, the wire bonding apparatus 1 further includes a lifting mechanism 22. The lifting mechanism 22 moves the rod member 20 in the up-down direction (Z direction). In the embodiment shown in FIG. 2, the lifting mechanism 22 includes a frame 23 and a driving apparatus 24. The frame 23 extends in Z direction. The base part 20a of the rod member 20 is connected to the driving apparatus 24. The driving apparatus 24, for example, includes a rotary solenoid, and moves the rod member 20 in Z direction along the frame 23. The lifting mechanism 22 is not limited to the configuration shown in FIG. 2. Any configuration can be adopted for the lifting mechanism 22 as long as the rod member 22 is movable in Z direction.

The control apparatus 30 is a computer includes a processor, a memory, an input apparatus, a display apparatus, etc., and controls the operation of the entire wire bonding apparatus 1. In the control apparatus 30, a command input operation, etc., for an operator to manage the wire bonding apparatus 1 by using the input apparatus can be performed, and the operation condition of the wire bonding apparatus 1 can be visualized and displayed through the display apparatus. In addition, in the memory of the control apparatus 30, a control program for controlling, by the processor, various processes executed by the wire bonding apparatus 1 is stored. The control apparatus 30 realizes various functions to be described afterwards through executing the control program by the processor.

The control apparatus 30 is communicably connected with the XY stage 2, the Z direction driving mechanism 4, the clamp apparatus 6, the camera 9, the lifting mechanism 22, and the contact detection part 26. The control apparatus 30 transmits the control signal to the XY stage 2, the Z direction driving mechanism 4, the clamp apparatus 6, the camera 9, and the lifting mechanism 22, and controls the operation of the XY stage 2, the operation of the Z direction driving mechanism 4, the opening/closing operation of the clamp apparatus 6, the operation of the camera 9, the operation of the lifting mechanism 22, etc. In addition, the control apparatus 30 has a function of measuring an opening amount d (see (b) of FIG. 3) of the clamp apparatus 6 based on the position information of the clamp apparatus 6 at the time when the clamp apparatus 6 and the rod member 20 contact each other and calibrating the clamp apparatus 6 based on the measured opening amount d.

As shown in FIG. 1, the control apparatus 30 includes, as a functional configuration, an image acquisition part 31, a driving control part 32, a contact information acquisition part 33, a position information acquisition part 34, an opening amount measuring part 35, and a calibration part 36. The image acquisition part 31 acquires the image captured by the camera 9. The driving control part 32 transmits the control signal to the XY stage 2, the Z direction driving mechanism 4, and the lifting mechanism 22, and moves the rod member 20 in Z direction together with moving the clamp apparatus 6 and the capillary 7 in X direction, Y direction and Z direction.

The contact information acquisition part 33 acquires the contact information indicating that the clamp apparatus 6 and the rod member 20 contact each other from the contact detection part 26. The position information acquisition part 34 acquires position information of the clamp apparatus 6 in X direction, Y direction, and Z direction based on the encoder output of the XY stage 2 and the Z direction driving mechanism 4, for example. The opening amount measuring part 35 measures the opening amount of the pair of arms 12 of the clamp apparatus 6 based on the position information of the clamp apparatus 6. The calibration part 36 calibrates the clamp apparatus 6 based on the opening amount of the pair of arms 12 measured by the opening amount measuring part 35.

Then, with reference to FIG. 4, the function of the control apparatus 30 will be described in detail, and a method for calibrating the clamp apparatus 6 using the wire bonding apparatus 1 according to an embodiment is described.

Figure 4:
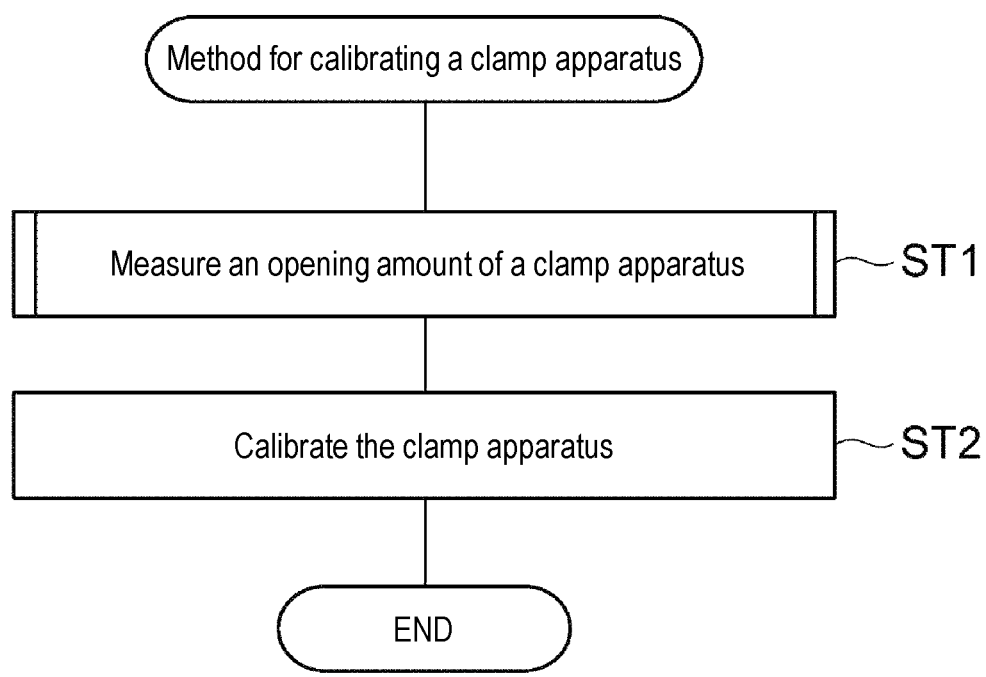
FIG. 4 is a flowchart illustrating a method for calibrating a clamp apparatus according to an embodiment.

FIG. 4 is a flowchart illustrating a method for calibrating the clamp apparatus 6 according to an embodiment. The calibration method shown in FIG. 4 is executed by the control apparatus 30 of the wire bonding apparatus 1. As shown in FIG. 4, in the calibration method, firstly, the opening amount of the clamp apparatus 6 is measured by the control apparatus 30 (Step ST1).

Figure 5:
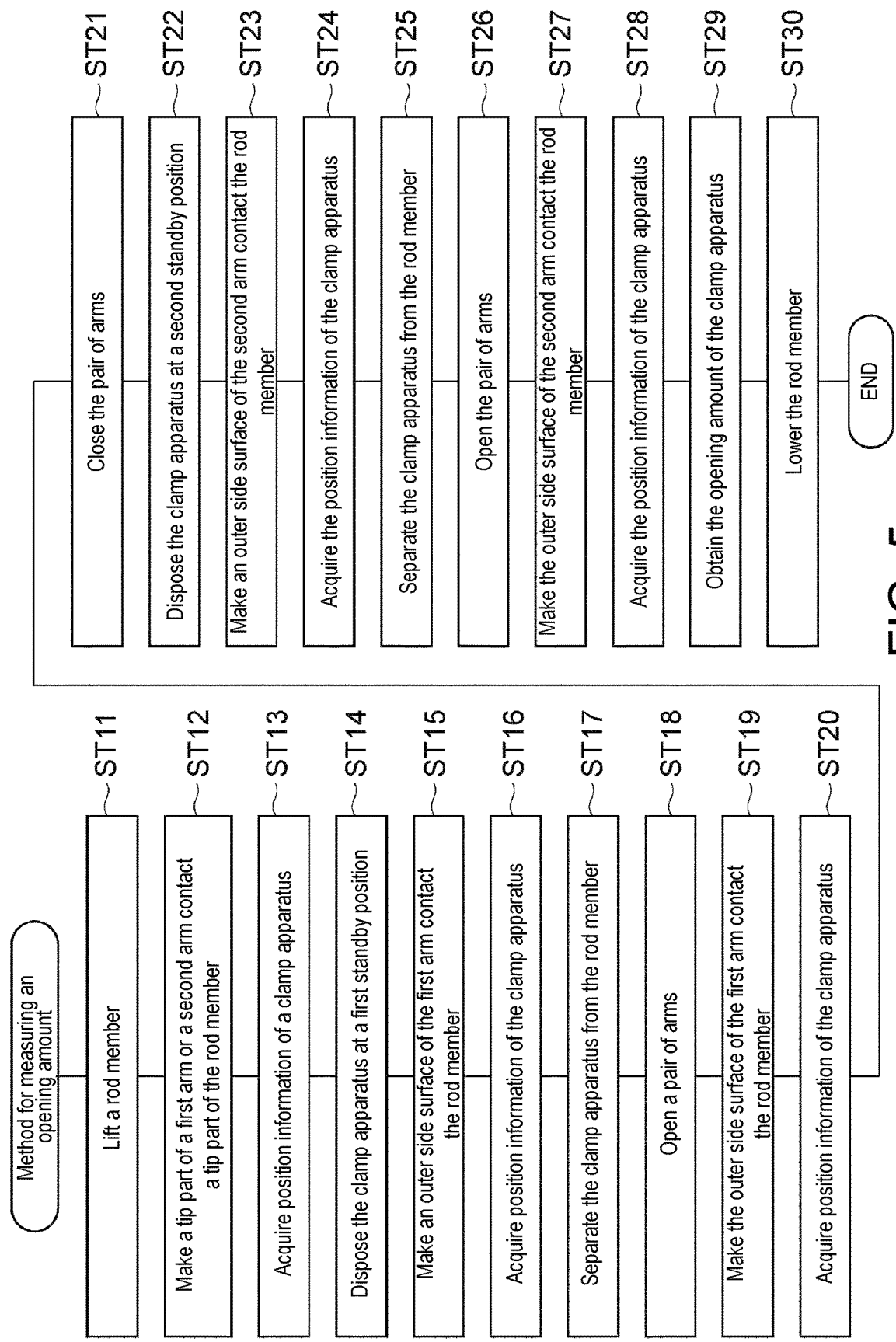
FIG. 5 is a flowchart illustrating a method for measuring an opening amount of a clamp apparatus according to an embodiment.

With reference to FIG. 5, a method for measuring the opening amount of the clamp apparatus 6 is described. FIG. 5 is a flowchart illustrating a method for measuring an opening amount of the clamp apparatus 6. As shown in FIG. 5, in the measurement method, firstly, the driving control part 34 controls the lifting mechanism 22 to lift the rod member 20 so that the rod member 20 and the clamp apparatus 6 are at the same height position in Z direction (Step ST11).

Figure 6:
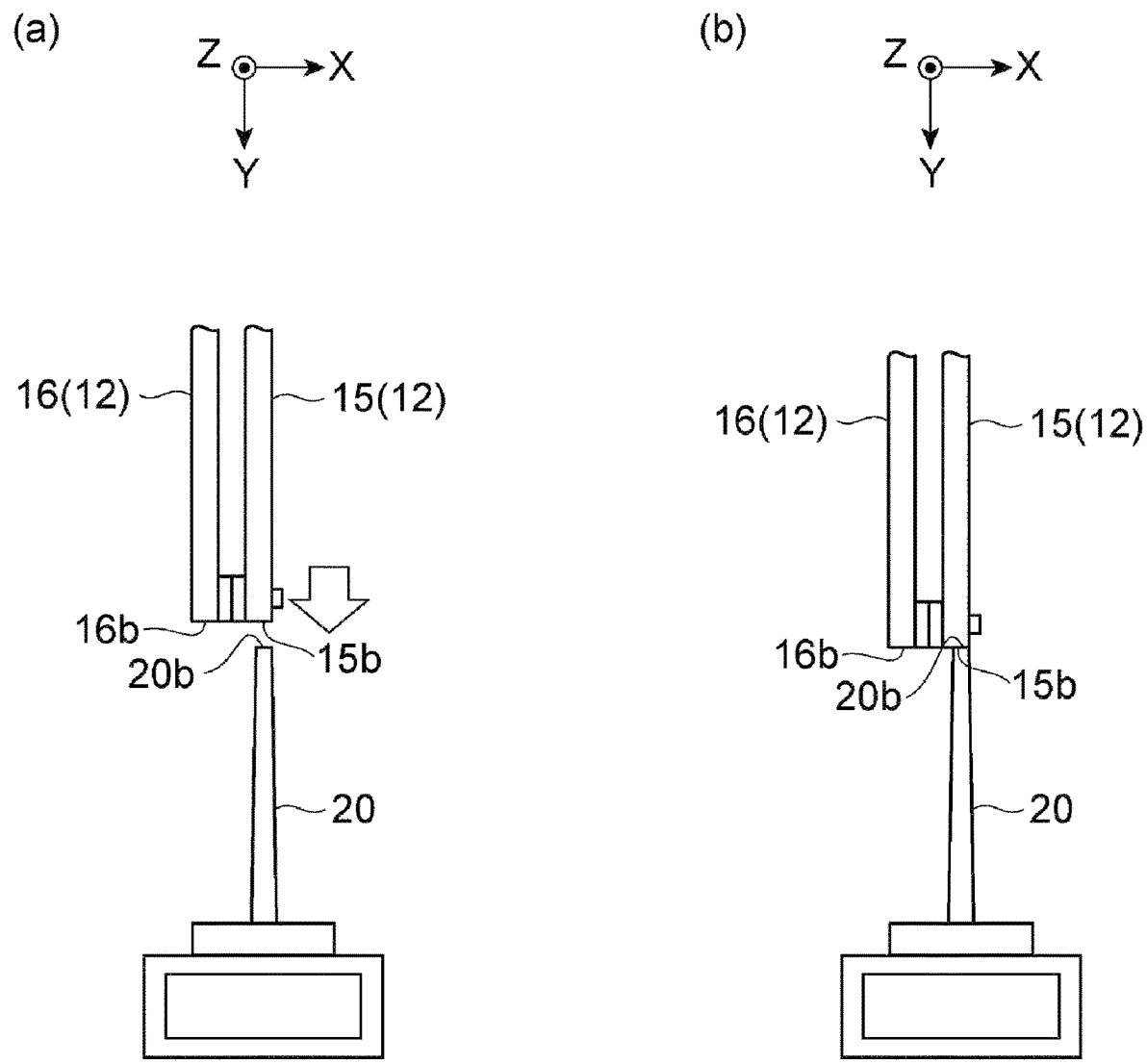
FIG. 6 is a schematic top view illustrating a movement of a clamp apparatus.

Then, as shown in (a) of FIG. 6, the driving control part 32 controls the XY stage 2 to dispose the clamp apparatus 6 behind the rod member 20 in Y direction and then move the clamp apparatus 6 toward the side of the rod member 20 along Y direction. Then, as shown in (b) of FIG. 6, the driving control part 32 makes the tip part 15b of the first arm 15 contact the tip part 20b of the rod member 20 (Step ST12). In Step ST12, the tip part 16b of the second arm 16 may also contact the tip part 20b of the rod member 20. Here, in Step ST11 and ST12, the tip part 15b of the first arm 15 or the tip part 16b of the second arm 16 may also contact the tip part 20b of the rod member 20 through the operator manually operating the input apparatus of the control apparatus 30.

When the contact of the first arm 15 or the second arm 16 with the rod member 20 is detected by the contact detection part 26, the contact information is transmitted from the contact detection part 26 to the control apparatus 30. When the contact information acquisition part 33 acquires the contact information, the position information acquisition part 34 acquires the position information of the clamp apparatus 6 on the XY plane based on the encoder output of the XY stage 2 (Step ST13) (sixth control, sixth process). With the position information, the position of the tip part 20b of the rod member 20 on the XY plane is grasped. The acquired position information of the clamp apparatus 6 is, for example, stored in the memory of the control apparatus 30.

Then, the driving control part 32 controls the XY stage 2 to move the clamp apparatus 6 to a first standby position (Step ST14). As shown in (a) of FIG. 7, the first standby position is a position at which the first arm 15 is disposed to be closer to the rod member 20 than the second arm 16 in X direction. For example, the first standby position is a position at which the outer side surface 15d of the first arm 15 and the rod member 20 are only separated by a distance Gx in X direction and the first arm 15 and the rod member 20 are only overlapped in a distance Gy in Y direction. While the disclosure is not limited thereto, the distance Gx is, for example, 500 μm, and the distance Gy is, for example, 300 μm.

Figure 7:
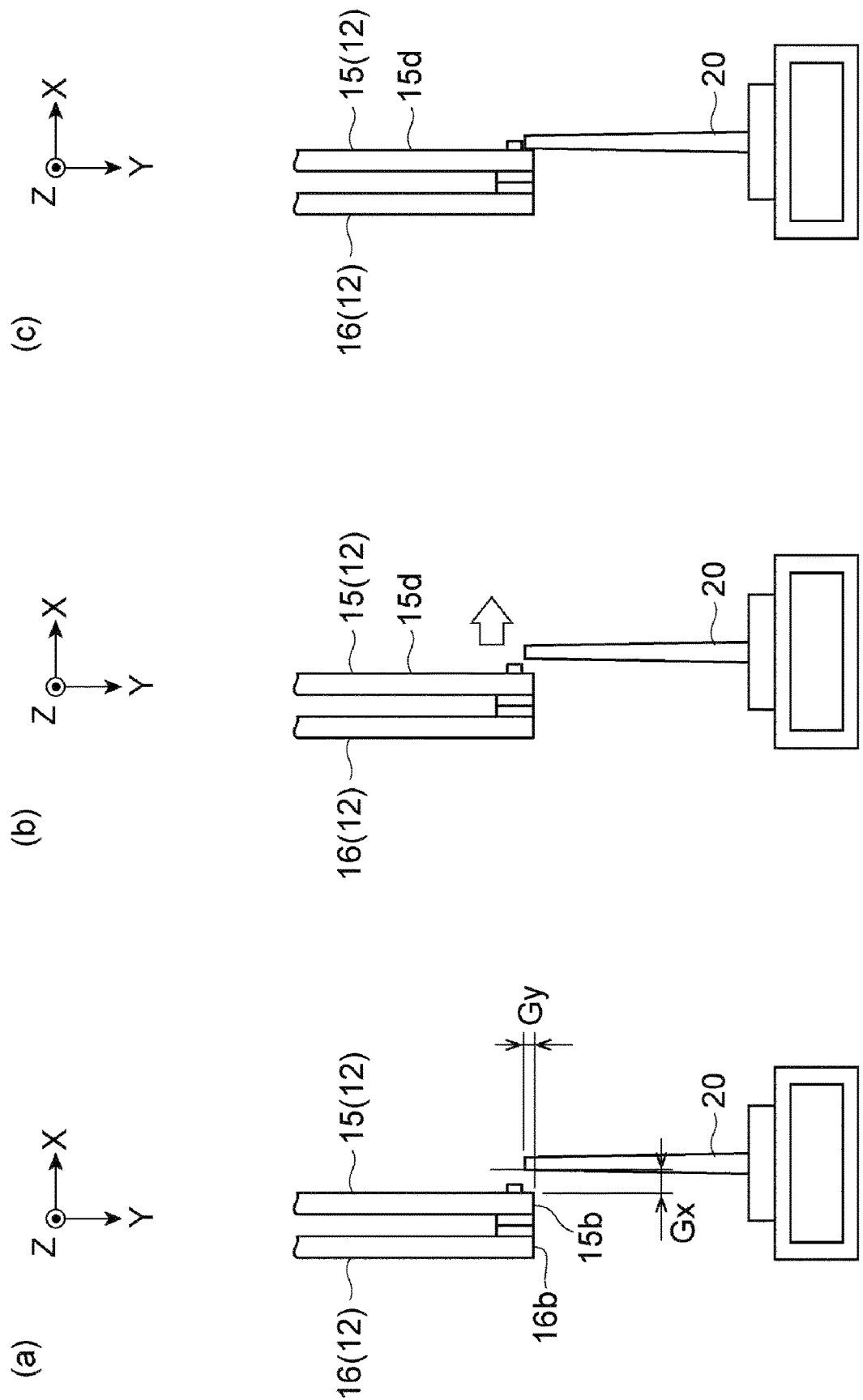
FIG. 7 is a schematic top view illustrating a movement of a clamp apparatus.

Then, as shown in (b) of FIG. 7, the driving control part 32 controls the XY stage 2 to move the clamp apparatus 6 to the side of the rod member 20 along X direction in the state where the pair of arms 12 are closed. Then, as shown in (c) of FIG. 7, the outer side surface 15d of the first arm 15 contacts the rod member 20 (Step ST15). At this time, the outer side surface 15d near the tip part 15b of the first arm 15 contacts the rod member 20.

When the contact of the outer side surface 15d of the first arm 15 with the rod member 20 is detected by the contact detection part 26, the contact information is transmitted from the contact detection part 26 to the control apparatus. When the contact information acquisition part 33 acquires the contact information, the position information acquisition part 34 acquires at least the position information of the clamp apparatus 6 in X direction (Step ST16) (first control, first process) based on the encoder output of the XY stage 2. The acquired position information of the clamp apparatus 6 is, for example, stored in the memory of the control apparatus 30.

Figure 8:
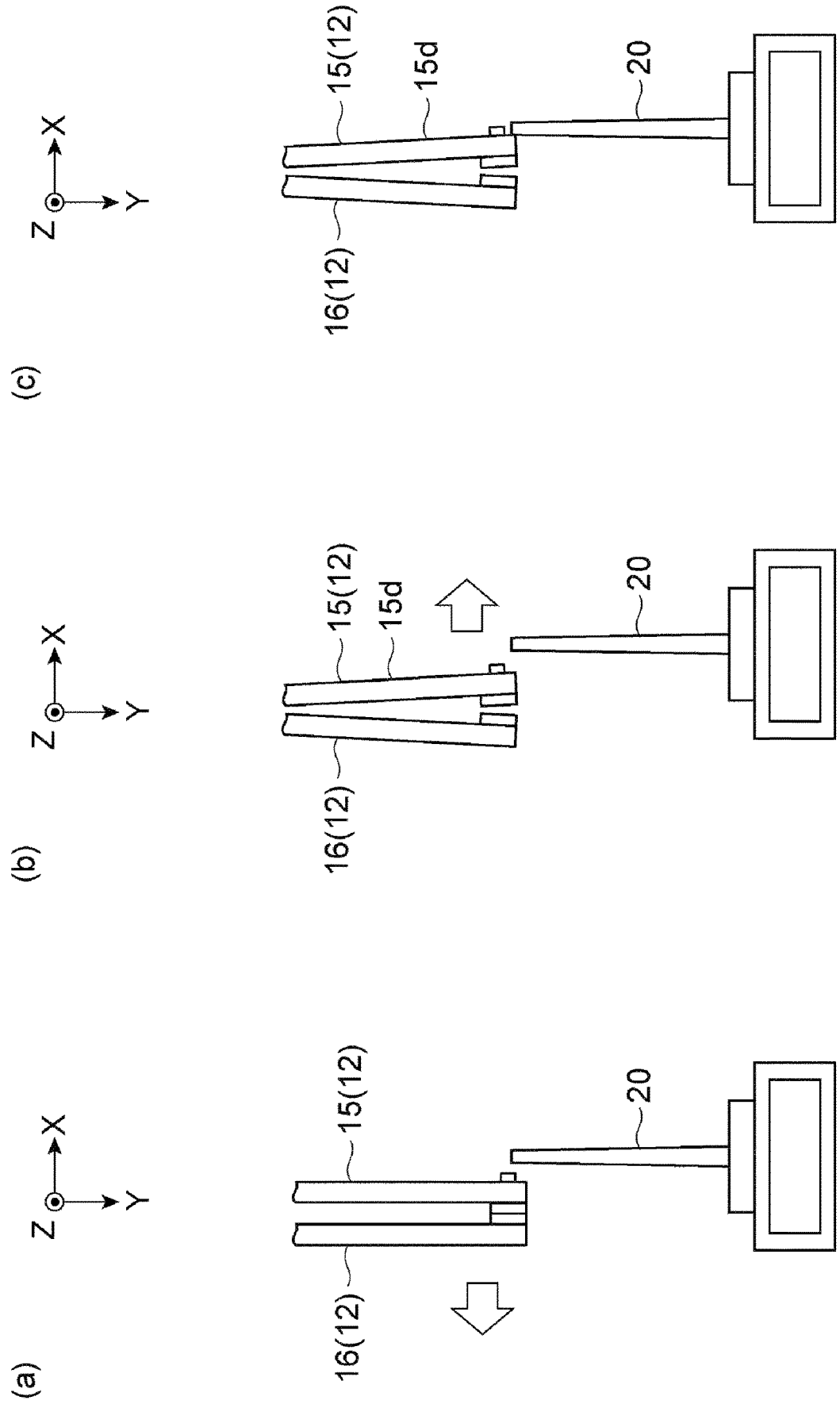
FIG. 8 is a schematic top view illustrating a movement of a clamp apparatus.

Then, as shown in (a) of FIG. 8, the driving control part 32 controls the XY stage 2 to move the clamp apparatus 6 along X direction in a direction away from the rod member 20 and dispose the clamp apparatus 6 at the first standby position (Step ST17). That is, the driving control part 32 separates the clamp apparatus 6 from the rod member 20.

Then, the driving control part 32 transmits a control signal designating the opening amount of the clamp apparatus 6 to be the designated opening amount to the clamp apparatus 6, thereby opening the pair of arms 12 (Step ST18). For example, the driving control part 32 applies a voltage corresponding to the designated opening amount to the driving part 14 of the clamp apparatus 6. Then, as shown in (b) of FIG. 8, the driving control part 32 moves the clamp apparatus 6 to the side of the rod member 20 along X direction in the state where the pair of arms 12 are open. Then, as shown in (c) of FIG. 8, the outer side surface 15d of the first arm 15 contacts the rod member 20 (Step ST19). At this time, the outer side surface 15d near the tip part 15b of the first arm 15 contacts the rod member 20.

When the contact of the outer side surface 15d of the first arm 15 with the rod member 20 is detected by the contact detection part 26, the contact information is transmitted from the contact detection part 26 to the control apparatus. When the contact information acquisition part 33 acquires the contact information, the position information acquisition part 34 acquires at least the position information of the clamp apparatus 6 in X direction (Step ST20) (second control, second process) based on the encoder output of the XY stage 2. The acquired position information of the clamp apparatus 6 is, for example, stored in the memory of the control apparatus 30.

Then, the driving control part 32 separates the clamp apparatus 6 from the rod member 20 and controls the clamp apparatus 6 to close the pair of arms 12 (Step ST21). Then, the driving control part 32 controls the XY stage 2 to move the clamp apparatus 6 to a second standby position (Step ST22). As shown in (a) of FIG. 9, the second standby position is a position separate from the first standby position via the rod member 20 in X direction, and is a position at which the second arm 16 is disposed to be closer to the rod member 20 than the first arm 15 in X direction. For example, the second standby position is a position at which the outer side surface 16d of the second arm 16 and the rod member 20 are only separated by the distance Gx in X direction and the tip part 16b of the second arm 16 is only overlapped with the tip part 20b of the rod member 20 in the distance Gy in Y direction. While the disclosure is not limited thereto, the distance Gx is, for example, 500 μm, and the distance Gy is, for example, 300 μm.

Then, as shown in (b) of FIG. 9, the driving control part 32 moves the clamp apparatus 6 from the second standby position toward the rod member 20 along X direction. Then, as shown in (c) of FIG. 9, the outer side surface 16d of the second arm 16 contacts the rod member 20 (Step ST23).

When the contact of the outer side surface 16d of the second arm 16 with the rod member 20 is detected by the contact detection part 26, the contact information is transmitted from the contact detection part 26 to the control apparatus. When the contact information acquisition part 33 acquires the contact information, the position information acquisition part 34 acquires at least the position information of the clamp apparatus 6 in X direction (Step ST24) (fourth control, fourth process) based on the encoder output of the XY stage 2. The acquired position information of the clamp apparatus 6 is, for example, stored in the memory of the control apparatus 30.

Then, as shown in (a) of FIG. 10, the driving control part 32 controls the XY stage 2 to move the clamp apparatus 6 along X direction in a direction away from the rod member 20 and dispose the clamp apparatus 6 at the second standby position (Step ST25). That is, the driving control part 32 separates the clamp apparatus 6 from the rod member 20.

Then, the driving control part 32 transmits a control signal designating the opening amount of the clamp apparatus 6 to the designated opening amount to the clamp apparatus 6 to open the pair of arms 12 (Step ST26). Then, as shown in (b) of FIG. 10, the driving control part 32 moves the clamp apparatus 6 to the side of the rod member 20 along X direction in the state where the pair of arms 12 are open. Then, as shown in (c) of FIG. 10, the outer side surface 16d of the second arm 16 contacts the rod member 20 (Step ST27). At this time, the outer side surface 16d near the tip part 16b of the second arm 16 contacts the rod member 20.

When the contact of the outer side surface 16d of the second arm 16 with the rod member 20 is detected by the contact detection part 26, the contact information is transmitted from the contact detection part 26 to the control apparatus. When the contact information acquisition part 33 acquires the contact information, the position information acquisition part 34 acquires at least the position information of the clamp apparatus 6 in X direction (Step ST28) (fifth control, fifth process) based on the encoder output of the XY stage 2. The acquired position information of the clamp apparatus 6 is, for example, stored in the memory of the control apparatus 30.

Then, the opening amount measuring part 35 measures the opening amount of the clamp apparatus 6 (Step ST29) (third control, third process) based on the position information respectively acquired in Step ST16, Step ST20, Step ST24, and Step ST28. For example, a difference value between the position information of the clamp apparatus 6 in X direction acquired in Step ST20 and the position information of the clamp apparatus 6 in X direction acquired in Step ST16 represents the movement amount of the first arm 15 in X direction when the clamp apparatus 6 is changed from the closed state to the open state. In addition, a difference value between the position information of the clamp apparatus 6 in X direction acquired in Step ST28 and the position information of the clamp apparatus 6 in X direction acquired in Step ST24 represents the movement amount of the second arm 16 in X direction when the clamp apparatus 6 is changed from the closed state to the open state.

For example, in the case where the position information of the clamp apparatus 6 in X direction acquired in Step ST16, Step ST20, Step ST24, and Step ST28 are respectively set as x1, x2, x3, and x4, the opening amount measuring part 35 can obtain the opening amount d of the clamp apparatus 6 in accordance with Formula (1) as follows.

$$d=|x2-x1|+|x4-x3| \quad (1)$$

After the opening amount of the clamp apparatus 6 is measured, the driving control part 32 controls the lifting mechanism 22 to lower the clamp apparatus 6 (Step ST30). By lowering the clamp apparatus 6, the clamp apparatus can be prevented from contacting or interfering with the rod member 20.

Referring to FIG. 4 again, as shown in FIG. 4, after the opening amount of the clamp apparatus 6 is measured, the calibration part 36 calibrates the clamp apparatus 6 (Step ST2) based on the measured opening amount of the clamp apparatus 6. The calibration is performed by correcting the voltage applied to the driving part 14 of the clamp apparatus 6 so that in Step ST18 and Step ST26, the opening amount designated by the control apparatus 30 is consistent with the opening amount measured in Step 29.

In the wire bonding apparatus 1, the opening amount of the pair of arms 12 is obtained based on the position information at the time when the outer side surface 15d of the first arm 15 contacts the rod member 20 in the state where the pair of arms 12 are closed, the position information at the time when the outer side surface 15d of the first arm 15 contacts the rod member 20 in the state where the pair of arms 12 are open, the position information at the time when the outer side surface 16d of the second arm 16 contacts the rod member 20 in the state where the pair of arms are closed, and the position information at the time when the outer side surface 16d of the second arm 16 contacts the rod member 20 in the state where the pair of arms 12 are open. Therefore, the opening amount of the clamp apparatus 6 can be measured in the state where the clamp apparatus 6 is installed to the wire bonding apparatus 1.

In addition, in the wire bonding apparatus 1, since the clamp apparatus 6 is calibrated based on the measured opening amount of the clamp apparatus 6, the error between the opening amount of the clamp apparatus designated by the control apparatus 30 and the actual opening amount of the clamp apparatus can be small.

In addition, in the wire bonding apparatus 1, since the rod member 20 can be moved in Z direction, at the time of bonding the semiconductor chip D, the rod member 20 can retreat in Z direction. As a result, the rod member 20 can be prevented from contacting or interfering with the clamp apparatus 6.

While various embodiments relating to the wire bonding apparatus 1, the method for measuring the opening amount of the clamp apparatus 6 using the wire bonding apparatus 1, and the method for calibrating the clamp apparatus 6 have been described above, the disclosure is not limited to the above embodiments. Various modifications can be configured within the scope of not changing the gist of the present invention.

For example, while the wire bonding apparatus 1 shown in FIG. 2 includes the lifting mechanism 22 for moving the rod member 20 along the frame 23 in Z direction, the wire bonding apparatus 1 can include any configuration as long as the rod member 20 is movable along Z direction. In addition, while the contact detection part 26 detects the contact between the clamp apparatus 6 and the rod member 20 based on the current flowing to the rod member 20, the contact detection part 26 may also detect the contact between the clamp apparatus 6 and the rod member 20 in a different way.

In the above embodiment, the opening amount of the pair of arms 12 is obtained based on the position information when the outer side surface 15d of the first arm 15 contacts the rod member 20 and the position information when the outer side surface 16d of the second arm 16 contacts the rod member 20. However, in another embodiment, the opening amount of the pair of arms 12 may also be obtained based on only the position information when one of the pair of arms 12 contacts the rod member 20.

For example, the control apparatus 30 may make the outer side surface 15d of the first arm 15 contact the rod member 20 in the state where the pair of arms 12 are closed and acquires the position information of the clamp apparatus 6 at the time of contacting the rod member 20, make the outer side surface 15d of the first arm 15 contact the rod member 20 in the state where the pair of arms 12 are open and acquires the position information of the clamp apparatus 6 at the time of contacting the rod member 20, and obtain the opening amount of the pair of arms based on the two acquired position information of the clamp apparatus 6. For example, in the case where the position information in X direction at the time when the outer side surface 15d of the first arm 15 contacts the rod member 20 in the state where the pair of arms 12 are closed is set as position information x1 and the position information at the time when the outer side surface 15d of the first arm 15 contacts the rod member 20 in the state where the pair of arms 12 are open is set as position information x2, the movement amount of the first arm 15 in X direction is represented as |x2−x1|. The control apparatus 30 may, for example, double the movement amount of the first arm 15 to obtain the opening amount of the pair of arms 12.

What is claimed is:

1. A wire bonding apparatus, comprising:
   a clamp apparatus, having a pair of arms;
   a stage, moving the clamp apparatus in a horizontal direction;
   a rod member;
   a contact detection part, detecting contact between the rod member and the clamp apparatus; and
   a control apparatus, controlling opening and closing of the pair of arms and an operation of the stage and acquiring position information of the clamp apparatus, wherein:
   the control apparatus executes a first control to make an outer side surface of a first arm of the pair of arms contact the rod member in a state where the pair of arms are closed by moving the clamp apparatus, and acquires the position information of the clamp apparatus at a time of contacting the rod member,
   executes a second control to make the outer side surface of the first arm contact the rod member in a state where the pair of arms are open by moving the clamp apparatus, and acquires the position information of the clamp apparatus at the time of contacting the rod member, and
   executes a third control to obtain an opening amount of the pair of arms based on the position information of the clamp apparatus acquired in the first control and the second control.

2. The wire bonding apparatus as claimed in claim 1, wherein the control apparatus further executes a fourth control to make an outer side surface of a second arm of the pair of arms contact the rod member in the state where the pair of arms are closed by moving the clamp apparatus, and acquires the position information of the clamp apparatus at the time of contacting the rod member, and
   executes a fifth control to make the outer side surface of the second arm contact the rod member in the state where the pair of arms are open by moving the clamp apparatus, and acquires the position information of the clamp apparatus at the time of contacting the rod member,
   wherein in the third control, the control apparatus further uses the position information of the clamp apparatus acquired in the fourth control and the fifth control to obtain the opening amount of the pair of arms.

3. The wire bonding apparatus as claimed in claim 2, wherein the control apparatus further executes a sixth control, which is executed prior to the first control, to make a tip part of the first arm or the second arm contact a tip part of the rod member by moving the clamp apparatus, and acquires the position information of the clamp apparatus at the time of contacting the rod member.

4. The wire bonding apparatus as claimed in claim 1, further comprising a lifting mechanism moving the rod member in an up-down direction.

5. A method for measuring an opening amount of a clamp apparatus having a pair of arms able to open or close, the method comprising:
   a first process of making an outer side surface of a first arm of the pair of arms contact a rod member in a state where the pair of arms are closed by moving the clamp apparatus, and acquiring position information of the clamp apparatus at a time of contacting the rod member, a second process of making the outer side surface of the first arm contact the rod member in a state where the pair of arms are open by moving the clamp apparatus, and acquiring the position information of the clamp apparatus at the time of contacting the rod member, and a third process of obtaining an opening amount of the pair of arms based on the position information of the clamp apparatus acquired in the first process and the second process.

6. The method for measuring the opening amount of the clamp apparatus as claimed in claim 5, further comprising: a fourth process of making an outer side surface of a second arm of the pair of arms contact the rod member in the state where the pair of arms are closed by moving the clamp apparatus, and acquiring the position information of the clamp apparatus at the time of contacting the rod member, and a fifth process of making the outer side surface of the second arm contact the rod member in the state where the pair of arms are open by moving the clamp apparatus, and acquiring the position information of the clamp apparatus at the time of contacting the rod member, wherein in the third process, the opening amount of the pair of arms is obtained by further using the position information of the clamp apparatus acquired in the fourth process and the fifth process.

7. The method for measuring the opening amount of the clamp apparatus as claimed in claim 6, further comprising a sixth process, which is executed prior to the first process, of making a tip part of the first arm or the second arm contact a tip part of the rod member by moving the clamp apparatus, and acquiring the position information of the clamp apparatus at the time of contacting the rod member.

8. A method for calibrating a clamp apparatus, comprising:

a process of obtaining an opening amount of a clamp apparatus according to the method for measuring the opening amount of the clamp apparatus as claimed in claim 5; and a process of calibrating the clamp apparatus based on the opening amount of the clamp apparatus.

* * * * *